(12) United States Patent
Mirgorodski et al.

(10) Patent No.: US 6,985,386 B1
(45) Date of Patent: Jan. 10, 2006

(54) PROGRAMMING METHOD FOR NONVOLATILE MEMORY CELL

(75) Inventors: Yuri Mirgorodski, Sunnyvale, CA (US); Pavel Poplevine, Foster City, CA (US); Peter J. Hopper, San Jose, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/895,713

(22) Filed: Jul. 8, 2004

(51) Int. Cl.
*G11C 16/04* (2006.01)

(52) U.S. Cl. .............................. 365/185.05; 365/185.1; 365/185.14; 365/185.2; 365/185.28

(58) Field of Classification Search ........... 365/185.05, 365/185.1, 185.14, 185.2, 185.28
See application file for complete search history.

(56) References Cited

U.S. PATENT DOCUMENTS

| | | | | |
|---|---|---|---|---|
| 4,228,527 A | * | 10/1980 | Gerber et al. | 365/185.08 |
| 5,364,806 A | * | 11/1994 | Ma et al. | 438/266 |
| 5,686,332 A | * | 11/1997 | Hong | 438/261 |
| 6,324,095 B1 | * | 11/2001 | McPartland et al. | 365/185.05 |

OTHER PUBLICATIONS

U.S. Appl. No. 10/665,185, filed Sep. 17, 2003.
U.S. Appl. No. 10/664,489, filed Sep. 17, 2003.
U.S. Appl. No. 10/895,711, filed Jul. 8, 2004.
U.S. Appl. No. 10/895,710, filed Jul. 8, 2004.
U.S. Appl. No. 10/895,712, filed Jul. 8, 2004.

* cited by examiner

*Primary Examiner*—Hoai Ho
(74) *Attorney, Agent, or Firm*—Vedder Price Kaufman & Kammholz, P.C.

(57) ABSTRACT

A method of programming a nonvolatile memory cell in which a ramped control voltage is used to obtain the desired voltage on the storage node.

5 Claims, 6 Drawing Sheets

FIG. 9C      FIG. 9D

PROGRAMMING METHOD FOR NONVOLATILE MEMORY CELL

BACKGROUND OF THE INVENTION

1. Field of the Invention

The present invention relates to nonvolatile memory (NVM) cells, and in particular to programming methods for NVM cells.

2. Description of the Related Art

Prior programming methods for nonvolatile memory cells based upon P-channel insulated gate field effect transistors (P-IGFETs), e.g., P-type metal oxide semiconductor field effect transistors (P-MOSFETs), as applied to conventional stacked gate cells, have used either pulses of negative voltage applied to the drain electrode with the shorted source and bulk regions grounded, or pulses of positive voltage applied to the shorted source and bulk regions while the drain region is grounded. Such methods can provide reasonably good programming, provided that the coupling ratio between the control electrode and the floating gate as well as the erasing conditions remain consistent. However, variances in either or both of these factors can introduce significant variances in programming results.

SUMMARY OF THE INVENTION

In accordance with the presently claimed invention, a method of programming a nonvolatile memory cell uses a ramped control voltage to obtain the desired voltage on the storage node.

In accordance with one embodiment of the presently claimed invention, a method of programming a memory cell with a plurality of P-channel insulated gate field effect transistors (P-IGFETs), each having a gate, a drain, a source and an N-well, and including a control P-IGFET with a control electrode connecting its drain, source and N-well, a write P-IGFET with a write electrode connecting its source and N-well, a read P-IGFET with a read electrode connecting its source and N-well, an erase P-IGFET with an erase electrode connecting its drain, source and N-well, and a shared electrode connecting the control, write, read and erase P-IGFET gates, includes:

applying a substantially fixed reference voltage to the control electrode, the write P-IGFET drain, the write electrode, the read P-IGFET drain, the read electrode and the erase electrode;

applying to the control electrode a substantially fixed programming voltage which is more positive than the reference voltage;

applying to the write electrode another substantially fixed programming voltage which is more positive than the reference voltage; and adjusting the programming voltage applied to the control electrode in an approximately ramped manner from the substantially fixed voltage to the reference voltage.

In accordance with another embodiment of the presently claimed invention, a method of programming a memory cell with a plurality of P-channel insulated gate field effect transistors (P-IGFETs), each having a gate, a drain, a source and an N-well, and including a control capacitor with first and second electrodes, a write P-IGFET with a write electrode connecting its source and N-well, a read P-IGFET with a read electrode connecting its source and N-well, an erase P-IGFET with an erase electrode connecting its drain, source and N-well, and a shared electrode connecting the first control capacitor electrode and the write, read and erase P-IGFET gates, includes:

applying a substantially fixed reference voltage to the second control capacitor electrode, the write P-IGFET drain, the write electrode, the read P-IGFET drain, the read electrode and the erase electrode;

applying to the second control capacitor electrode a substantially programming fixed voltage which is more positive than the reference voltage;

applying to the write electrode another substantially fixed programming voltage which is more positive than the reference voltage; and adjusting the programming voltage applied to the second control capacitor electrode in an approximately ramped manner from the substantially fixed voltage to the reference voltage.

In accordance with still another embodiment of the presently claimed invention, a method of programming a memory cell with a plurality of P-channel insulated gate field effect transistors (P-IGFETs), each having a gate, a drain, a source and an N-well, and including a gated diode with a gate, an anode and a cathode, a control P-IGFET with a control electrode connecting its drain, source and N-well, a read P-IGFET with a read electrode connecting its source and N-well, an erase P-IGFET with an erase electrode connecting its drain, source and N-well, and a shared electrode connecting the gated diode gate and the control, read and erase P-IGFET gates, includes:

applying a substantially fixed reference voltage to the control electrode, the gated diode anode, the gated diode cathode, the read P-IGFET drain, the read electrode and the erase electrode;

applying to the control electrode a substantially fixed programming voltage which is more positive than the reference voltage;

applying to the gated diode anode another substantially fixed programming voltage which is more positive than the reference voltage; and adjusting the programming voltage applied to the control electrode in an approximately ramped manner from the substantially fixed voltage to the reference voltage.

In accordance with still another embodiment of the presently claimed invention, a method of programming a memory cell with a plurality of P-channel insulated gate field effect transistors (P-IGFETs), each having a gate, a drain, a source and an N-well, and including a control capacitor with first and second electrodes, a gated diode with a gate, an anode and a cathode, a read P-IGFET with a read electrode connecting its source and N-well, an erase P-IGFET with an erase electrode connecting its drain, source and N-well, and a shared electrode connecting the first control capacitor electrode, the gated diode gate, and the read and erase P-IGFET gates, includes:

applying a substantially fixed reference voltage to the second control capacitor electrode, the gated diode anode, the gated diode cathode, the read P-IGFET drain, the read electrode and the erase electrode;

applying to the second control capacitor electrode a substantially fixed programming voltage which is more positive than the reference voltage;

applying to the gated diode anode another substantially fixed programming voltage which is more positive than the reference voltage; and adjusting the programming voltage applied to the second control capacitor electrode in an approximately ramped manner from the substantially fixed voltage to the reference voltage.

In accordance with still another embodiment of the presently claimed invention, a method of programming a stacked gate memory cell that includes spaced apart P-type diffusion regions formed in an N-type semiconductor substrate to define drain and source regions with a substrate channel region therebetween, a conductive floating gate electrode formed over the channel region and separated therefrom by gate dielectric material, and a conductive control gate electrode formed over the floating gate electrode and separated therefrom by an intergate dielectric material, includes:

applying a substantially fixed reference voltage to the control gate electrode, the drain region and the source region;

applying to the control gate electrode a substantially fixed programming voltage which is more positive than the reference voltage;

applying to the source region another substantially fixed programming voltage which is more positive than the reference voltage; and adjusting the programming voltage applied to the control gate electrode in an approximately ramped manner from the substantially fixed voltage to the reference voltage.

BRIEF DESCRIPTION OF THE DRAWINGS

FIGS. 9A–9D illustrate a programming method in accordance with another embodiment of the presently claimed invention for use with NVM cells implemented in conformance with FIG. 2.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
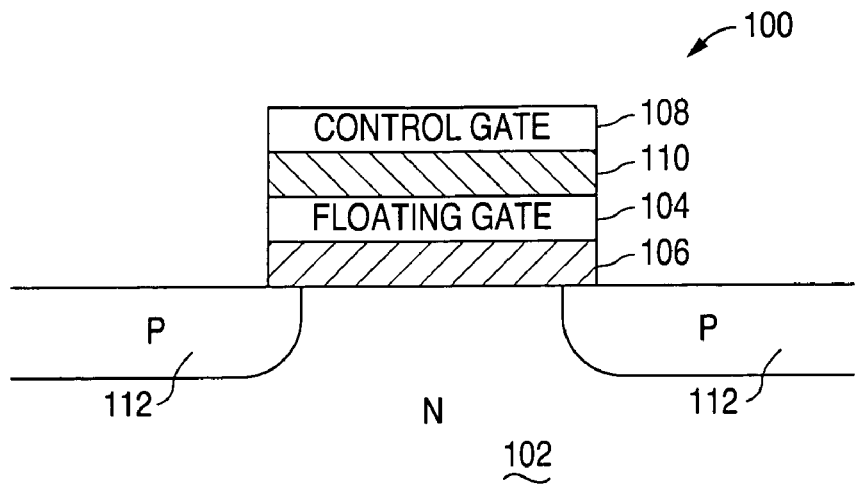
FIG. 1 is a partial cross sectional view of a conventional P-channel insulated gate field effect transistor (P-IGFET) stacked gate NVM cell.

Referring to FIG. 1, a conventional P-IGFET (e.g., P-channel metal oxide semiconductor field effect transistor, or P-MOSFET) stacked gate NVM cell 100 is formed in an N-type region 102 of semiconductor material (e.g., crystalline silicon). As is well known, such N-type region 102 is typically an N-well formed in a P-type silicon substrate. The cell 100 includes a conductive floating gate 104 (e.g., polysilicon) that is separated from the N-type region 102 by a layer of thin gate dielectric material 106 (e.g., silicon dioxide). A control gate electrode 108 (e.g., polysilicon) is separated from the floating gate 104 by a layer of intergate dielectric material 110 (e.g., a sandwich of oxide-nitride-oxide). Two P-type diffusion regions 112 formed at the sides of the stacked gate structure provide the source and drain regions of the cell 100 and define an N-type channel region between them. Fabrication techniques available for making such cells 100 are well known.

As is well known, such a cell uses hot electron injection in a conventional method of programming NVM cells. When applied to such a stacked gate cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative but lower in absolute value as compared with the drain potential. Under such conditions, a high lateral electrical field is generated, thereby creating hot electrons, which are affected by a high perpendicular electrical field such that the hot electrons tunnel through the thin gate oxide 106 to reach the floating gate 104. The amount of injection current depends primarily upon the potentials of the drain region and floating gate electrodes such that with more drain voltage more injection takes place. (Further discussion of such a memory cell and programming technique can be found in U.S. Pat. No. 6,137,723, the disclosure of which is incorporated herein by reference.)

Figure 2:
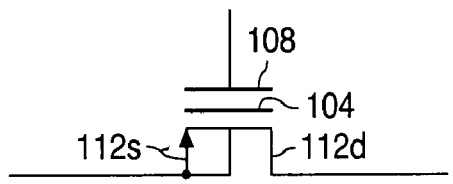
FIG. 2 is a schematic diagram for the NVM cell of FIG. 1.

Referring to FIG. 2, the memory cell 100 of FIG. 1 can be represented in electrical schematic form as shown.

Referring to FIG. 1, a conventional P-IGFET (e.g., P-channel metal oxide semiconductor field effect transistor, or P-MOSFET) stacked gate NVM cell 100 is formed in an N-type region 102 of semiconductor material (e.g., crystalline silicon). As is well known, such N-type region 102 is typically an N-well formed in a P-type silicon substrate. The cell 100 includes a conductive floating gate 104 (e.g., polysilicon) that is separated from the N-type region 102 by a layer of thin gate dielectric material 106 (e.g., silicon dioxide). A control gate electrode 108 (e.g., polysilicon) is separated from the floating gate 104 by a layer of intergate dielectric material 110 (e.g., a sandwich of oxide-nitrideoxide). Two P-type diffusion regions 112 formed at the sides of the stacked gate structure provide the source and drain regions of the cell 100 and define an N-type channel region between them. Fabrication techniques available for making such cells 100 are well known.

As is well known, such a cell uses hot electron injection in a conventional method of programming NVM cells. When applied to such a stacked gate cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative but lower in absolute value as compared with the drain potential. Under such conditions, a high lateral electrical field is generated, thereby creating hot electrons, which are affected by a high perpendicular electrical field such that the hot electrons tunnel through the thin gate oxide 106 to reach the floating gate 104. The amount of injection current depends primarily upon the potentials of the drain region and floating gate electrodes such that with more drain voltage more injection takes place. (Further discussion of such a memory cell and programming technique can be found in U.S. Pat. No. 6,137,723, the disclosure of which is incorporated herein by reference.)

Referring to FIG. 2, the memory cell 100 of FIG. 1 can be represented in electrical schematic form as shown.

Figure 3:
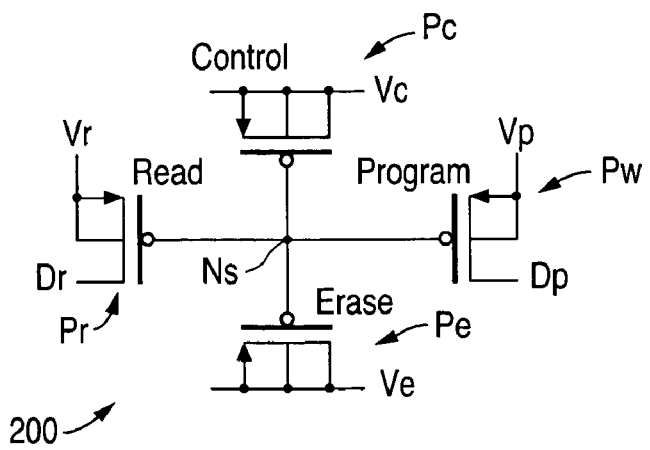
FIG. 3 is a schematic diagram of an alternative NVM cell.

Referring to FIG. 3, an alternative memory cell 200 includes four P-IGFETs, with one transistor for each of the cell functions (programs or write, read, erase and control). Such a cell 200, while being somewhat larger in size or circuit area than a conventional stacked gate cell within an integrated circuit environment, allows for independent and improved optimization of each cell function.

The program, or write, function is controlled by a transistor Pw with interconnected source and bulk regions to which a programming voltage Vp is applied, a drain region to which a programming signal Dp is applied, and a gate electrode connected to the storage node Ns. The read function is controlled by a transistor Pr having interconnected source and bulk regions to which a read voltage Vr is applied, a drain region from which a read signal Dr is received, and a gate electrode connected to the storage node Ns. The erase function is controlled by a transistor Pe having interconnected drain, source and bulk regions to which an erase voltage Ve is applied, and a gate electrode connected to the storage node Ns. The control function is controlled by a transistor Pc having interconnected drain, source and bulk regions to which a control voltage Vc is applied, and a gate electrode connected to the storage node Ns.

Programming such a memory cell 200 in a conventional manner would be as follows. During programming, or writing, a programming voltage Vp (e.g., approximately 5 volts) is applied, with all other electrodes being connected to the circuit reference potential (e.g., ground). During erasing, an erase voltage Ve is applied (e.g., approximately 10 volts), with all other electrodes connected to the circuit reference potential. During reading, a read voltage Vr is applied (e.g., approximately 1 volt), and all other electrodes are connected to the circuit reference potential. (Such voltages are typical for oxide thicknesses in the range of 60–80 Angstroms.)

Figure 4:
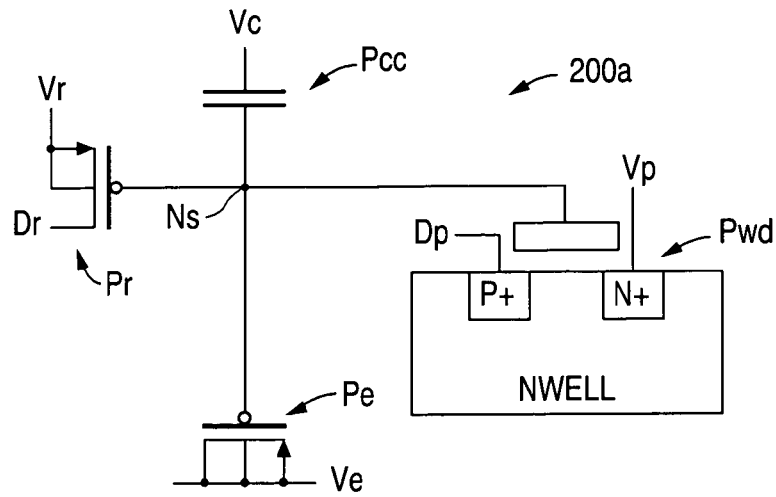
FIG. 4 is a schematic diagram of another alternative NVM cell.

Referring to FIG. 4, another alternative memory cell 200a is similar in design in that four separate devices are used for controlling the four respective functions (program, read, erase, control). However, as can be seen, the device Pcc used for the control function can be a capacitor instead of a transistor. Similarly, the programming, or writing, function can be controlled through the use of a gated diode Pwd instead of a transistor Pw. Hence, with reference to FIGS. 3 and 4, it can be seen that a memory cell in accordance with the presently claimed invention may include four transistors, three transistors and a capacitor, three transistors and a gated diode, or a combination of two transistors, a capacitor and a gated diode.

Figure 5:
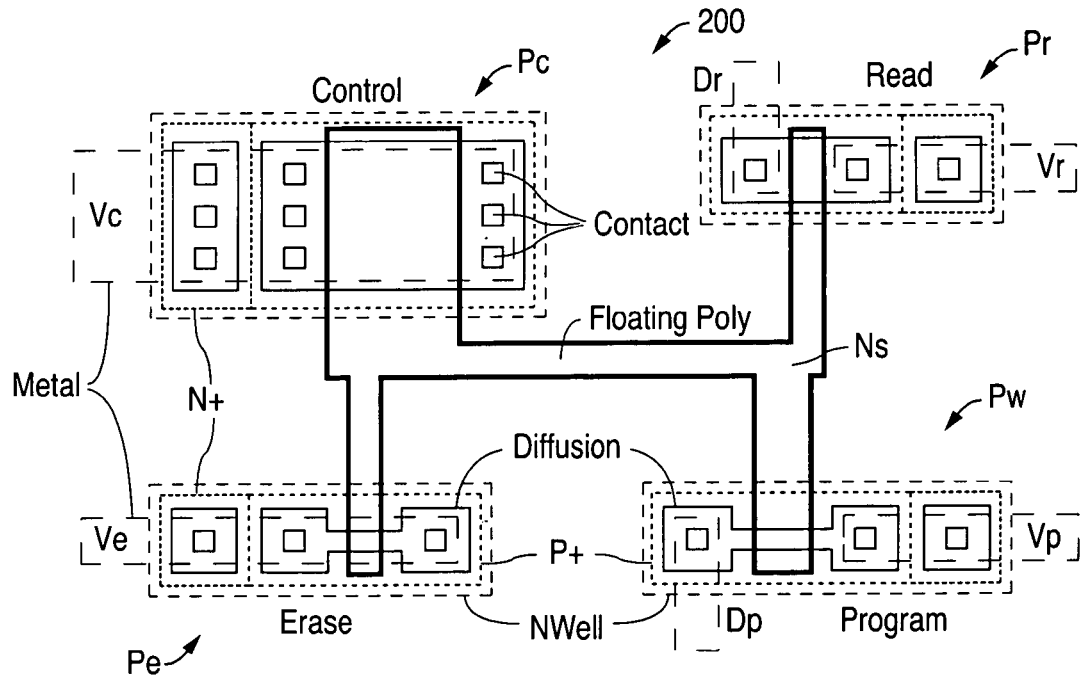
FIG. 5 is a plan view of a portion of an integrated circuit containing a NVM cell in conformance with the schematic diagram of FIG. 3.

Referring to FIG. 5, the design flexibility available with such a memory cell 200 can be better appreciated. For example, larger transistors can be used for the read function, thereby increasing the read signal current and speed. Conversely, a smaller transistor can be used for the programming, or writing, function, thereby reducing programming current and capacitance. Also, using an independent device for the control function allows different voltages to be used for the various functions, thereby allowing for optimization for each function.

Figure 6:
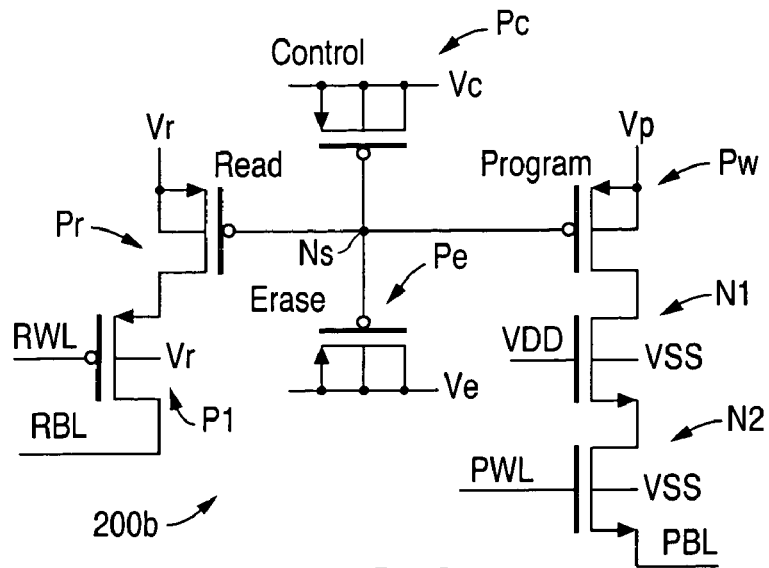
FIG. 6 is a schematic diagram of another alternative NVM cell.

Referring to FIG. 6, another alternative memory cell 200b includes additional transistors P1, N1, N2 for facilitating the use of such a memory cell 200b within an array of such cells. For example, to read data from the storage node Ns, a P-channel pass transistor P1 is used. To program data to the storage node Ns, a cascode circuit of two N-channel pass transistors N1, N2 is used to prevent a high voltage from appearing between a gate electrode and a drain or source region.

Figure 7:
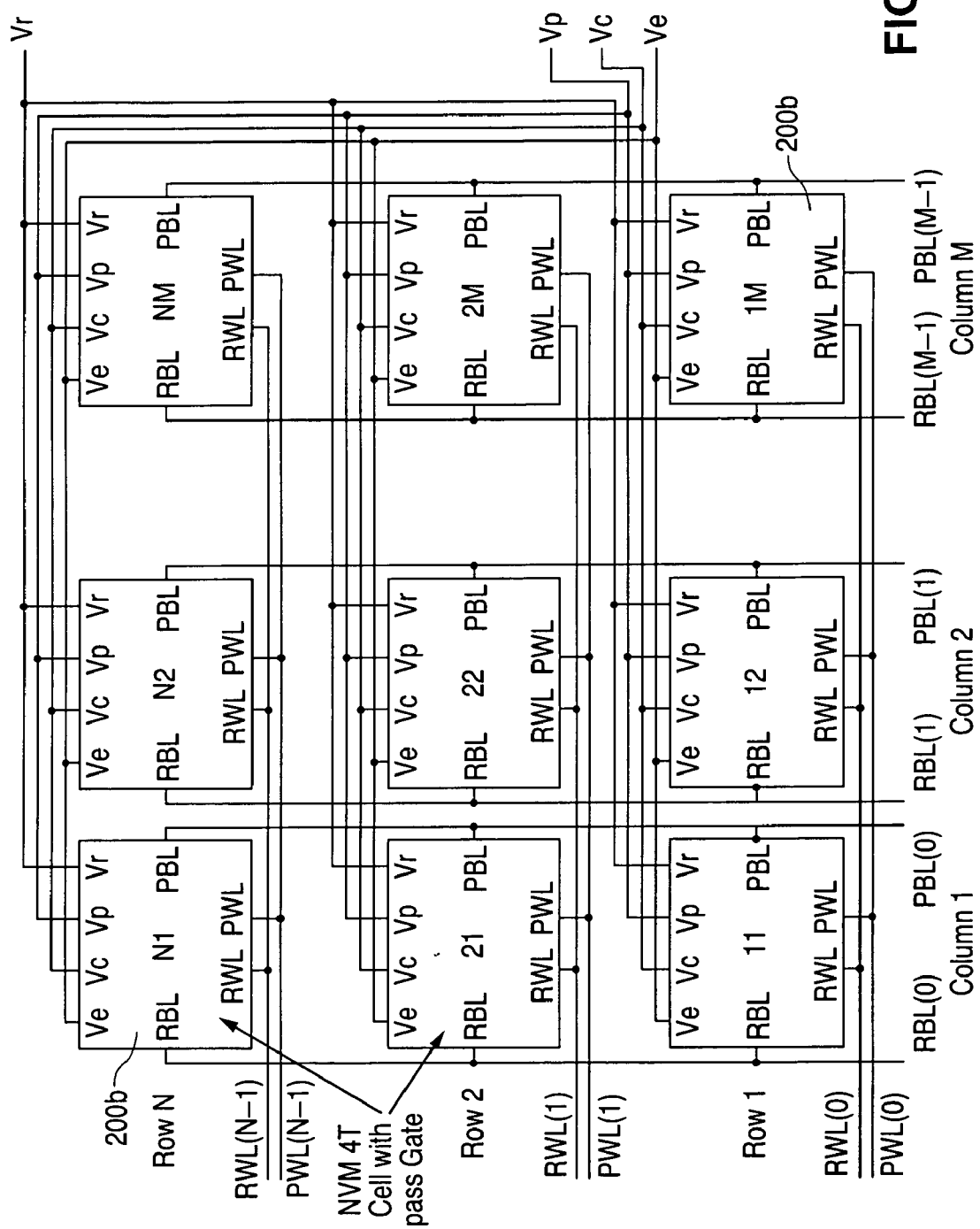
FIG. 7 is a functional block diagram of a NVM cell array composed of a plurality of NVM cells in conformance with the schematic diagram of FIG. 6.

Referring to FIG. 7, the memory cell 200b of FIG. 6 can be incorporated into an array as shown. Such an array has M columns and N rows. The program word line PWL selects the rows to be programmed, while the read word line RWL selects the rows to be read. The erase voltage Ve, program voltage Vp, control voltage Vc and read voltage Vr are applied to each cell directly. With no high voltage switches or other supporting circuitry, significantly simplified connections can be made from the external or internal voltage and signal sources and to the signal destinations.

The operational modes of erase, program and read are similar to those for a single cell. During erase mode, the program word lines PWL(0)–PWL(N-1) are at a logic low, the read word lines RWL(0)–RWL(N-1) are at a logic high, the erase voltage Ve is applied, and the rest of the signal lines are at circuit reference potential. This causes all cells to be erased.

During programming mode, the read word lines RWL(0)–RWL(N-1) are at a logic high, one of the program word lines, e.g., PWL(0), will be at a logic high while the remaining program word lines, e.g., PWL(1)–PWL(N-1), will be at a logic low. To program a particular cell 200b, the corresponding program bit line, e.g., PBL(0), will be at a logic low. To erase the remaining cells 200b, the corresponding program bit lines, e.g., PBL(1)–PBL(M-1), will be left floating. The program voltage Vp is applied to all cells 200b, while the remaining electrodes are at circuit reference potential.

During the read mode of operation, the program word lines PWL(0)–PWL(N-1) are at a logic low, one of the read word lines, e.g., RWL(0), will be at a logic low, while the remaining read word lines, e.g., RWL(1)–RWL(N1) will be at a logic high. On each of the read bit lines RBL(0)-RBL(M-1) a high current or voltage will be received for each corresponding cell that had been programmed, while a low current or voltage will be received for each corresponding cell that had been erased. The read voltage Vr is applied to all cells 200b, while the remaining electrodes are at circuit reference potential.

Figure 8A:
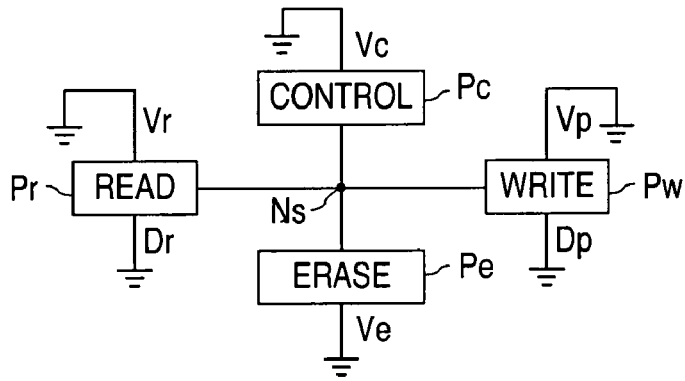
FIGS. 8A–8D illustrate a programming method in accordance with one embodiment of the presently claimed invention for NVM cells implemented in conformance with FIGS. 3 and 4.
Figure 8B:
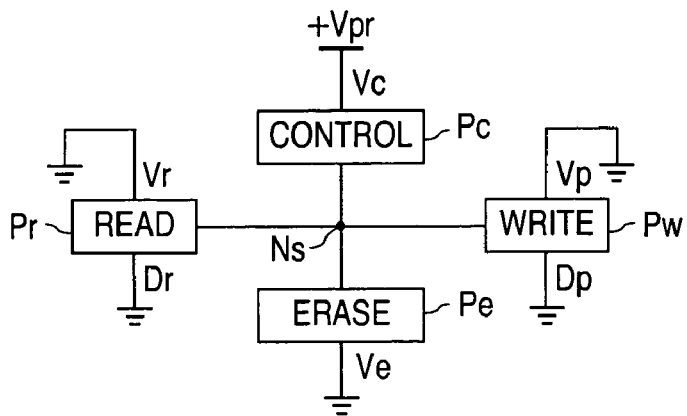
Figure 8C:
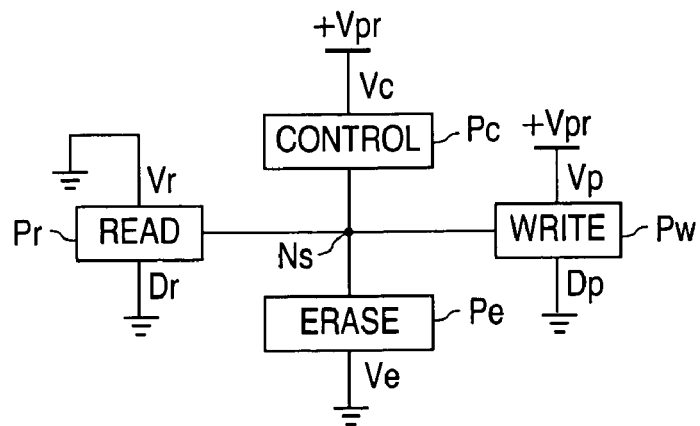
Figure 8D:
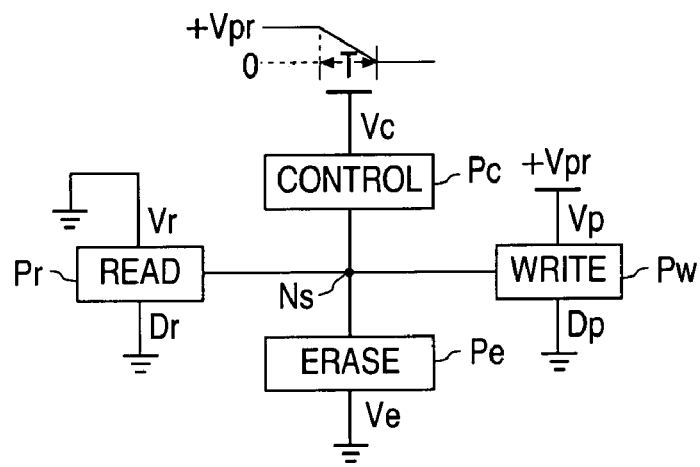

Referring to FIGS. 8A–8D, a programming method in accordance with one embodiment of the presently claimed invention is as follows. First, as shown in FIG. 8A, all of the electrodes of the control devices Pw, Pr, Pc, Pe are connected to the circuit reference potential, e.g., circuit ground. Second, as shown in FIG. 8B, a positive programming voltage +Vpr is applied to the control voltage electrode Vc of the control device Pc, while the other electrodes remain at circuit reference potential. Third, as shown in FIG. 8C, the positive programming voltage +Vpr is applied to the programming voltage terminal Vp of the write device Pw, while the control voltage electrode remains at the positive programming voltage +Vpr and the other electrodes remain at circuit reference potential. Fourth, as shown in FIG. 8D, the programming voltage applied at the control voltage Vc of the control device Pc is ramped from the positive programming voltage +Vpr down to the circuit reference potential.

Figure 9A:
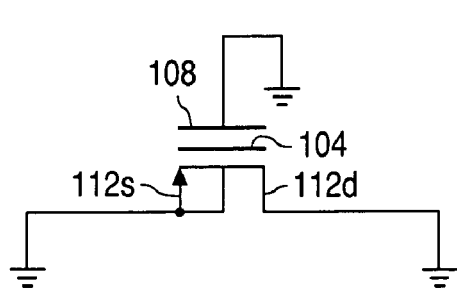
Figure 9B:
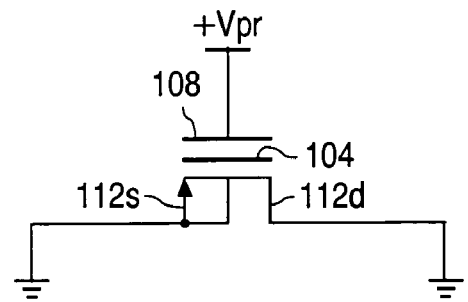

Referring to FIGS. 9A–9D, such programming can also be performed using a conventional stacked gate cell. First, as shown in FIG. 9A, the drain 112$d$, shorted source and bulk regions 112$s$, and control gate 108 are connected to circuit reference potential, e.g., ground. Second, as shown in FIG. 9B, the control gate 108 is driven by the positive programming voltage +Vpr, while the other electrodes 112$d$, 112$s$ remain at circuit reference potential. Third, as shown in FIG. 9C, the shorted source and bulk regions 112$s$ are driven by the positive programming voltage Vpr, while the control gate 108 remains at the positive programming voltage +Vpr and the drain region 112$d$ remains at circuit reference potential. Fourth, as shown in FIG. 9D, while the shorted source and bulk regions remain at a positive programming voltage +Vpr and the drain region 112$d$ remain at the circuit reference potential, the voltage applied to the control gate 108 is ramped from the positive programming voltage Vpr down to circuit reference potential.

Based upon the foregoing, it should be understood that after the second programming step, the voltage at the storage node Ns and floating gate 104 that is already positive after erasing, will be even more positive due to the coupling of the control device Pc or control gate 108. Following the third step (FIGS. 8C and 9C), the cell is ready for programming. During the ramping down of the control voltage (FIGS. 8D and 9D), the voltage at the storage node Ns and floating gate 104 decreases, i.e., becomes less positive, to the point where hot electron injection begins, following which the storage node Ns and floating gate 104 receive negative charges and undergo a corresponding voltage shift of approximately 2 volts. The storage node Ns and floating gate 104 continue reducing in potential until the ramp reaches its final voltage value.

Figure 10:
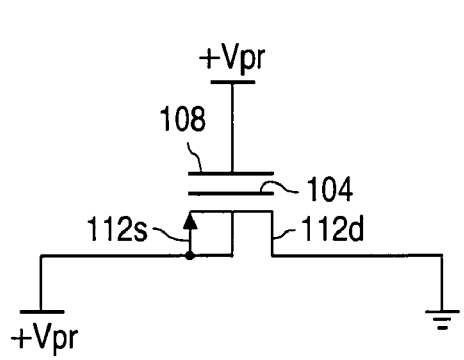
FIG. 10 illustrates the constant injection current achieved using a programming method in accordance with the presently claimed invention.
Figure 10:
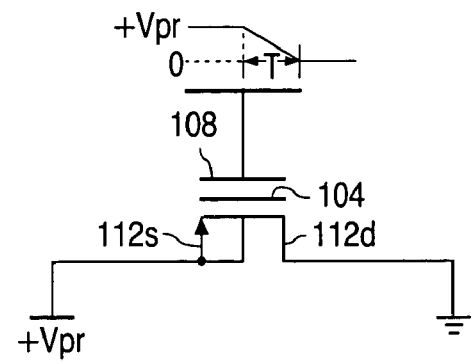
Figure 10:
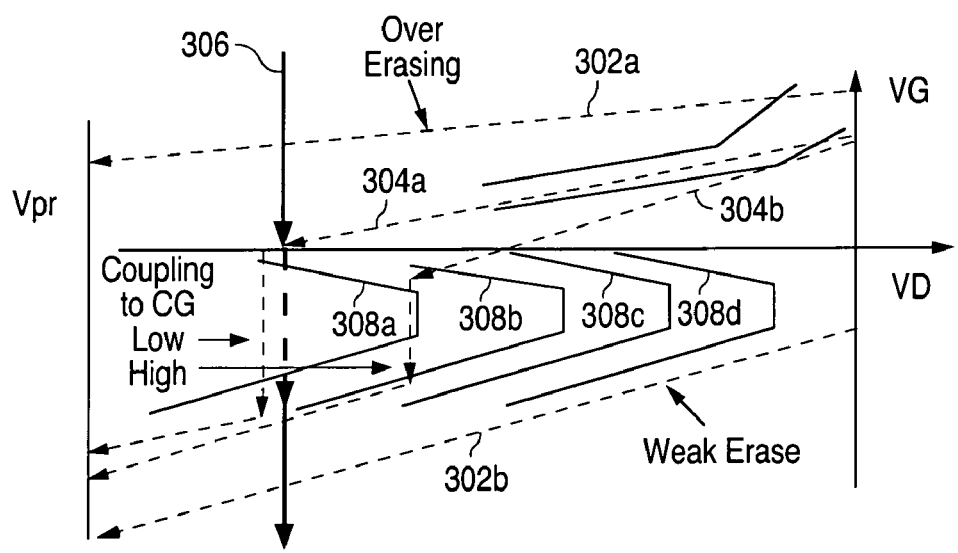

Referring to FIG. 10, as a result of this programming method, significantly more stable programming results absent extremely large variations in coupling ratio or erasing conditions. Current through the write device Pw, however, is increased due to the continuing change in the potential of the storage node Ns and floating gate 104 following termination of the hot electron injection.

As indicated in FIG. 10, dashed lines 302$a$ and 302$b$ represent the paths of the floating gate voltage during conventional programming for conditions of over erasing and weak erasing, respectively, while dashed lines 304$a$ and 304$b$ represent paths of the floating gate voltage for low and high coupling conditions, respectively. In conformance with the presently claimed programming method, as represented by line 306, constant injection current results as indicated by lines 308$a$, 308$b$, 308$c$, 308$d$ as a function of gate Vg and drain Vd voltages with the source region grounded. As indicated, the programming effect is dependent upon the drain voltage Vd rather than either the coupling ratio or erasing conditions.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of programming a memory cell with a plurality of P-channel insulated gate field effect transistors (P-IGFETs), each having a gate, a drain, a source and an N-well, and including a control P-IGFET with a control electrode connecting its drain, source and N-well, a write P-IGFET with a write electrode connecting its source and N-well, a read P-IGFET with a read electrode connecting its source and N-well, an erase P-IGFET with an erase electrode connecting its drain, source and N-well, and a shared electrode connecting said control, write, read and erase P-IGFET gates, said method comprising:
   applying a substantially fixed reference voltage to said control electrode, said write P-IGFET drain, said write electrode, said read P-IGFET drain, said read electrode and said erase electrode;
   applying to said control electrode a substantially fixed programming voltage which is more positive than said reference voltage;
   applying to said write electrode another substantially fixed programming voltage which is more positive than said reference voltage; and
   adjusting said programming voltage applied to said control electrode in an approximately ramped manner from said substantially fixed voltage to said reference voltage.

2. A method of programming a memory cell with a plurality of P-channel insulated gate field effect transistors (P-IGFETs), each having a gate, a drain, a source and an N-well, and including a control capacitor with first and second electrodes, a write P-IGFET with a write electrode connecting its source and N-well, a read P-IGFET with a read electrode connecting its source and N-well, an erase P-IGFET with an erase electrode connecting its drain, source and N-well, and a shared electrode connecting said first control capacitor electrode and said write, read and erase P-IGFET gates, said method comprising:
   applying a substantially fixed reference voltage to said second control capacitor electrode, said write P-IGFET drain, said write electrode, said read P-IGFET drain, said read electrode and said erase electrode;
   applying to said second control capacitor electrode a substantially programming fixed voltage which is more positive than said reference voltage;
   applying to said write electrode another substantially fixed programming voltage which is more positive than said reference voltage; and
   adjusting said programming voltage applied to said second control capacitor electrode in an approximately ramped manner from said substantially fixed voltage to said reference voltage.

3. A method of programming a memory cell with a plurality of P-channel insulated gate field effect transistors (P-IGFETs), each having a gate, a drain, a source and an N-well, and including a gated diode with a gate, an anode and a cathode, a control P-IGFET with a control electrode connecting its drain, source and N-well, a read P-IGFET with a read electrode connecting its source and N-well, an erase P-IGFET with an erase electrode connecting its drain, source and N-well, and a shared electrode connecting said gated diode gate and said control, read and erase P-IGFET gates, said method comprising:

applying a substantially fixed reference voltage to said control electrode, said gated diode anode, said gated diode cathode, said read P-IGFET drain, said read electrode and said erase electrode;

applying to said control electrode a substantially fixed programming voltage which is more positive than said reference voltage;

applying to said gated diode anode another substantially fixed programming voltage which is more positive than said reference voltage; and adjusting said programming voltage applied to said control electrode in an approximately ramped manner from said substantially fixed voltage to said reference voltage.

4. A method of programming a memory cell with a plurality of P-channel insulated gate field effect transistors (P-IGFETs), each having a gate, a drain, a source and an N-well, and including a control capacitor with first and second electrodes, a gated diode with a gate, an anode and a cathode, a read P-IGFET with a read electrode connecting its source and N-well, an erase P-IGFET with an erase electrode connecting its drain, source and N-well, and a shared electrode connecting said first control capacitor electrode, said gated diode gate, and said read and erase P-IGFET gates, said method comprising:

applying a substantially fixed reference voltage to said second control capacitor electrode, said gated diode anode, said gated diode cathode, said read P-IGFET drain, said read electrode and said erase electrode;

applying to said second control capacitor electrode a substantially fixed programming voltage which is more positive than said reference voltage;

applying to said gated diode anode another substantially fixed programming voltage which is more positive than said reference voltage; and adjusting said programming voltage applied to said second control capacitor electrode in an approximately ramped manner from said substantially fixed voltage to said reference voltage.

5. A method of programming a stacked gate memory cell that includes spaced apart P-type diffusion regions formed in an N-type semiconductor substrate to define drain and source regions with a substrate channel region therebetween, a conductive floating gate electrode formed over the channel region and separated therefrom by gate dielectric material, and a conductive control gate electrode formed over the floating gate electrode and separated therefrom by an inter-gate dielectric material, said method comprising:

applying a substantially fixed reference voltage to said control gate electrode, said drain region and said source region;

applying to said control gate electrode a substantially fixed programming voltage which is more positive than said reference voltage;

applying to said source region another substantially fixed programming voltage which is more positive than said reference voltage; and adjusting said programming voltage applied to said control gate electrode in an approximately ramped manner from said substantially fixed voltage to said reference voltage.

* * * * *

UNITED STATES PATENT AND TRADEMARK OFFICE
CERTIFICATE OF CORRECTION

PATENT NO. : 6,985,386 B1 Page 1 of 1
DATED : January 10, 2006
INVENTOR(S) : Yuri Mirgorodski et al.

It is certified that error appears in the above-identified patent and that said Letters Patent is hereby corrected as shown below:

<u>Title page</u>,
Item [56], References Cited, OTHER PUBLICATIONS, delete
"U.S. Appl. No. 10/664,489, filed Sep. 17, 2003" and insert
-- U.S. Appl. No. 10/664,469, filed Sep. 17, 2003 --.

<u>Column 6</u>,
Line 58, delete "RWL(1)-RWL(N1)" and insert -- RWL(1)-RWL(N-1) --.

<u>Column 7</u>,
Line 31, delete "remain" and insert -- remains --.

Signed and Sealed this

Twenty-first Day of March, 2006

JON W. DUDAS
*Director of the United States Patent and Trademark Office*